United States Patent [19]

Truong et al.

[11] Patent Number: 5,229,662
[45] Date of Patent: Jul. 20, 1993

[54] LOGIC CIRCUIT CAPABLE OF OPERATING WITH ANY ONE OF A PLURALITY OF ALTERNATIVE VOLTAGE SUPPLY LEVELS

[75] Inventors: Mau N. Truong; Loren Yee, both of Milpitas; Nim C. Lam, Sunnyvale, all of Calif.

[73] Assignee: National Semiconductor Corporation, Santa Clara, Calif.

[21] Appl. No.: 765,575

[22] Filed: Sep. 25, 1991

[51] Int. Cl.[5] ..................... H03K 19/20; H03K 3/01
[52] U.S. Cl. ............................ 307/455; 307/296.6; 307/467
[58] Field of Search ............... 307/296.1, 296.6, 455, 307/465, 466, 467

[56] References Cited
U.S. PATENT DOCUMENTS

| | | | |
|---|---|---|---|
| 4,670,673 | 6/1987 | Varadarajan | 307/455 |
| 4,833,342 | 5/1989 | Kiryu et al. | 307/296.1 |
| 4,864,162 | 9/1989 | Maoz | 307/296.1 |
| 4,900,955 | 2/1990 | Kurpan | 307/296.1 |

Primary Examiner—Edward P. Westin
Assistant Examiner—Andrew Sanders
Attorney, Agent, or Firm—Limbach & Limbach

[57] ABSTRACT

An improved Emitter-Coupled Logic (ECL) circuit having a voltage comparator circuit connected to an emitter follower output circuit, the emitter follower output circuit includes an npn transistor having an emitter connected through a resistor to a voltage supply, and wherein the emitter follower output circuit produces a current in the resistor during operation of the ECL circuit, an improvement in the emitter follower output circuit including programmable connecting means for connecting the emitter follower output circuit to any one of a plurality of alternative voltage supplies, and maintaining means for maintaining substantially the same level of current in the resistor when the emitter follower output circuit is connected to any one of the plurality of alternative voltage supplies.

2 Claims, 3 Drawing Sheets

LOGIC CIRCUIT CAPABLE OF OPERATING WITH ANY ONE OF A PLURALITY OF ALTERNATIVE VOLTAGE SUPPLY LEVELS

BACKGROUND OF THE INVENTION

1. Field of the Invention

The present invention relates to digital logic circuits, and more particularly, to an improved logic circuit which can be programmably connected to any one of a plurality of alternative voltage supplies and maintain a substantially constant current in its output circuit.

2. Description of the Related Art

Digital systems operate by performing basic logic functions, such as NOT, AND, OR, etc. The circuits which implement these basic logic functions in a digital system are called logic circuits (or logic gates). Logic circuits are the basic building blocks in any digital system.

Logic circuits are usually constructed from transistors, resistors, and diodes. One or more logic circuits are often arranged in a "macro-cell" and stored in a macro-cell library. It is not uncommon for only the unconnected transistors, resistors, and diodes to be arranged in a macro-cell in order to allow flexibility in implementing various different logic functions. Many macro-cells are then collected together and arranged in a pattern on an Integrated Circuit (IC) chip. This pattern of macro-cells is called a "gate array." The macro-cells are then interconnected during manufacture of the chip to form a unit that performs whatever function is needed. These chips are combined with other equipment, such as power supplies, video monitors, keyboards, etc., to form the digital system.

In order for a logic circuit to function it must be connected to some type of voltage supply. Each of the different families of logic circuits that have evolved over the years, such as complementary-symmetry MOS (CMOS), transistor-transistor logic (TTL), and emitter-coupled logic (ECL), have their own voltage supply requirements. Traditionally, most of the logic circuits within one family have the same voltage supply requirements.

It is becoming common, however, for logic circuits within the same family to be custom designed to operate from other than the traditional voltage supply levels. One might refer to these emerging custom designed logic circuits as "sub-families" of different types of gate array macro-cells within the family. One reason for this recent trend is that, while a user may be satisfied with the characteristics of one family of logic circuits, in certain applications the user may desire to use that family with a lower voltage supply level in order to dissipate less power. The result of this trend is that a user who has by great expense installed a special voltage supply in a digital system for use with these custom designed logic circuits can no longer use standard logic circuits of the same family because they cannot operate from the special voltage supply level. Conversely, a user who has maintained the standard voltage supply level in a system for use with standard logic circuits cannot use the new sub-families of custom designed logic circuits which have emerged.

Thus, although any given number of users may all use logic circuits of the same family, there is no longer a guarantee that these users have identical voltage supplies installed in their systems. This has created a frustrating situation for IC chip manufacturers who, in order to sell their product, must now ask the user what voltage supply levels are available and then custom design logic circuits that will operate from that voltage level. This process has slowed production and decreased profits due to the extra time and cost involved in creating a confusing line of sub-families of different types of gate array macro-cells whose basic logic circuit design has been permanently altered in order for them to operate with special voltage supply levels.

FIG. 1 illustrates an example of a conventional logic circuit 8 which is currently being used with various different voltage supply levels. The logic circuit 8 is of the Emitter-Coupled Logic (ECL) family and includes a voltage-comparator circuit 12 (also called a current switch or difference amplifier) and an emitter follower output circuit 14, connected as shown. In order to understand the complications which arise in designing this logic circuit 8 to function with different voltage supply levels, it is necessary to give a detailed discussion of its operation.

The logic circuit 8 is basically a buffer gate, although only one digital input Vin is shown. During operation a digital input signal Vin is received at the base of NPN transistor 18. The digital input signal Vin, which is generated by other logic circuits present in a digital system, has a certain predetermined "dynamic signal range" (also called a "logic swing"). A common dynamic signal range for ECL logic is about $-1.5$ Volts for LOW logic level to about $-0.9$ Volts for HIGH logic level. The voltage-comparator circuit 12 compares the input signal Vin to a constant reference voltage signal Vref which is received at the base of NPN transistor 20. The reference voltage signal Vref is set at the midpoint of the dynamic signal range, or at about $-1.2$ Volts.

The voltage-comparator circuit 12 determines whether the digital input signal Vin is at a HIGH or LOW logic level by determining whether it is above or below the reference voltage signal Vref. The manner in which transistors 18 and 20 and resistors 22 and 24 make this determination is well known in the art and will be explained in greater detail below. The result of this determination is that if the digital input signal Vin is at a HIGH level, then a HIGH level signal is generated at node 23; if the digital input signal Vin is at a LOW level, then a LOW level signal is generated at node 23. The signal generated at node 23 is then delivered to the base of NPN transistor 34 in the emitter follower output circuit 14.

As is well known in the art, the output voltage of an emitter follower circuit follows its input (base) voltage quite closely. Thus, if a HIGH signal is received at the base of transistor 34, then a HIGH digital output signal Vout is produced at output node 37. If a LOW signal is received at the base of transistor 34, then a LOW digital output signal Vout is produced at output node 37. It is vital that the digital output signal Vout have substantially the same dynamic signal range as the digital input signal Vin. This is because the digital output signal Vout will often be delivered to other logic circuits within the digital system which will all utilize the same dynamic signal range.

In order for the logic circuit 8 to function, it must be connected to four voltage supplies. A voltage supply Vcc is connected at node 30, a voltage supply Vcc02 is connected at node 36, a voltage supply Vee is connected at node 32, and a voltage supply Vtt is connected at node 39. These voltage supplies are needed for transistors 18, 20, and 34 to function as described above. The voltage supplies Vcc and Vcc02, which are not at issue in the present discussion, are often connected to separate grounds; the grounds are separate so that the noise generated by the emitter follower output circuit 14 does not leak into the comparator-circuit 12.

The voltage supply Vtt is at the very heart of this discussion because it is the voltage supply with which many users of ECL logic have chosen to use alternative voltage supply levels. While many users wish to lower the voltage supply level Vtt to conserve power, often times the user desires Vtt to be connected to and utilize the same voltage supply as Vee. This is because it is less expensive for the user to have a single voltage supply for both Vee and Vtt in his or her digital system rather than two separate voltage supplies. Vee can be either −4.5 or −5.2 Volts depending upon the strength of voltage supply used; therefore, in this scenario, Vtt utilizes this same −4.5 or −5.2 Volts.

In a high density gate array environment, however, where many thousands of logic circuits are connected together in a single gate array (the gate arrays forming the digital system), power dissipation becomes crucial. If a logic circuit uses less power then it will operate at cooler temperatures. The power dissipated in the emitter follower output circuit 14 is equal to the current Ief (the 'current Ief' as used herein is intended to refer to the average current Ief) which flows through the resistor 38 multiplied by the voltage Vtt. It follows that if the voltage Vtt is reduced, and the current Ief stays the same, then less power will be dissipated. Thus, many users are using the logic circuit 8 with a lower Vtt; some commonly used reduced voltage levels for Vtt are −2.0 and −3.5 Volts. Because Vee must remain at either −4.5 or −5.2 Volts in order for the comparator circuit 12 to function properly, these users have by great expense had to install a separate voltage supply in their digital system in order to supply the reduced Vtt.

As discussed above, when alternative voltage supplies are used the logic circuit must be custom designed. The logic circuit must be custom designed because reducing the voltage supply level will have the effect of changing various current levels within the logic circuit. This is because, using logic circuit 8 as an example, when Vtt is connected to different voltage supply levels, the current Ief which flows through resistor 38 in the emitter follower output circuit 14 also changes. This phenomenon can be illustrated by a simple application of Kirchhoff's Voltage Law to the emitter follower output circuit 14: Ief=(Vout−Vtt)/Ref. Note that the digital output signal Vout remains substantially within its proper dynamic signal range even though Vtt is changed. This is because Vout is the output voltage of the emitter follower output circuit 14 and, as already stated, the output voltage of an emitter follower circuit will follow its input (base) voltage very closely. Therefore, since Vout remains substantially constant, and Ref is constant, Ief must change if Vtt changes. If Vtt is changed from −5.2 Volts to −2.0 Volts in order to reduce power dissipation, Ief will also be reduced in order to satisfy Kirchhoff's Voltage Law (the equation above). Thus, power, which equals Vtt multiplied by Ief will be reduced, but the current Ief will no longer be at its proper level. Therefore, in order to reduce power dissipation by changing Vtt and still permit the emitter follower output circuit 14 to function properly, the logic circuit 8 must be custom designed to maintain the current Ief at a constant level as Vtt is changed. In other words, there can be no change in Ief when Vtt is changed.

One custom designs the logic circuit 8 to maintain the current Ief at a constant level by varying the resistance Ref of the resistor 38. Referring again to Kirchhoff's Voltage Law, Ief=(Vout−Vtt)/Ref, it is easily seen that Ief can be maintained at a constant level if Ref is adjusted to compensate for changes in Vtt. Therefore, if Vtt is changed, Ief can be maintained at a constant level by changing Ref.

There are other reasons, besides power conservation, that the current Ief should be held at a constant level as Vtt is changed. An increase in Ief, due to a decrease in Vtt (e.g., −2.0 to −5.2), will decrease the switching time of the logic circuit, i.e., the time it takes the digital output signal Vout to switch from HIGH to LOW and vice versa. If the logic circuit is operating at this increased speed it may not function properly with other logic circuits within the digital system which may be operating at a reduced speed. Conversely, a decrease in Ief, due to an increase in Vtt (e.g., −5.2 to −2.0), will increase the switching time of the logic circuit. If the logic circuit is operating at this slower speed it may not function properly with other logic circuits which may be operating at an increased speed.

While varying the value of Ref may seem like a simple task to undertake in order to compensate for changes in Vtt, one must understand that these logic circuits are implemented in silicon. Once the silicon is formed to give Ref a certain value, Ref can no longer be changed. The logic circuit will operate with the correct current Ief only with the single value of Vtt that Ref was designed for. For example, if Ref is chosen so that the logic circuit will generate the proper current Ief using a Vtt of −2.0 Volts, the logic circuit can never be changed so that it will generate the same level of current Ief with a Vtt of −3.5, −4.5, or −5.2 Volts.

As mentioned above, a particularly frustrating situation has developed for IC chip manufacturers. These manufacturers must design and manufacture different logic circuits that can operate with each of the alternative voltage supplies that are currently used. For example, a manufacturer of the logic circuit 8 must manufacture a variation of this circuit that will generate a proper value of current Ief with a Vtt of −2.0 Volts, a variation that will generate the same value of current Ief with a Vtt of −3.5 Volts, a variation that will generate the same value of current Ief with a Vtt of −4.5 Volts, and a variation that will generate the same value of current Ief with a Vtt of −5.2 Volts. As can be seen, it would be highly desirable if there existed a single logic circuit that could function properly with any given one of a plurality of alternative voltage supplies which each supply different voltage levels.

Hence, there has developed a compelling need, particularly in the gate array environment, for an improved logic circuit that will operate properly when it is connected to any one of a plurality of alternative voltage supplies which each supply different voltage levels. This improved logic circuit must maintain the proper current levels in its output circuit no matter which voltage supply level it is connected to. In addition, there is also a compelling need, particularly in the gate array environment, for this improved logic circuit to be designed in such a way that it can be easily programmed to connect to and operate with the chosen voltage supply level.

SUMMARY OF THE INVENTION

The present invention provides an improved Emitter-Coupled Logic (ECL) circuit having a voltage comparator circuit connected to an emitter follower output circuit. The emitter follower output circuit includes an npn transistor having an emitter connected through a resistor to a voltage supply. The emitter follower output circuit produces a current in the resistor during operation of the ECL circuit. The improvement is in the emitter follower output circuit and includes a programmable connecting means for connecting the emitter follower output circuit to any one of a plurality of alternative voltage supplies, and a maintaining means for maintaining substantially the same level of current in the resistor when the emitter follower output circuit is connected to any one of the plurality of alternative voltage supplies.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE PREFERRED EMBODIMENT

Figure 1:
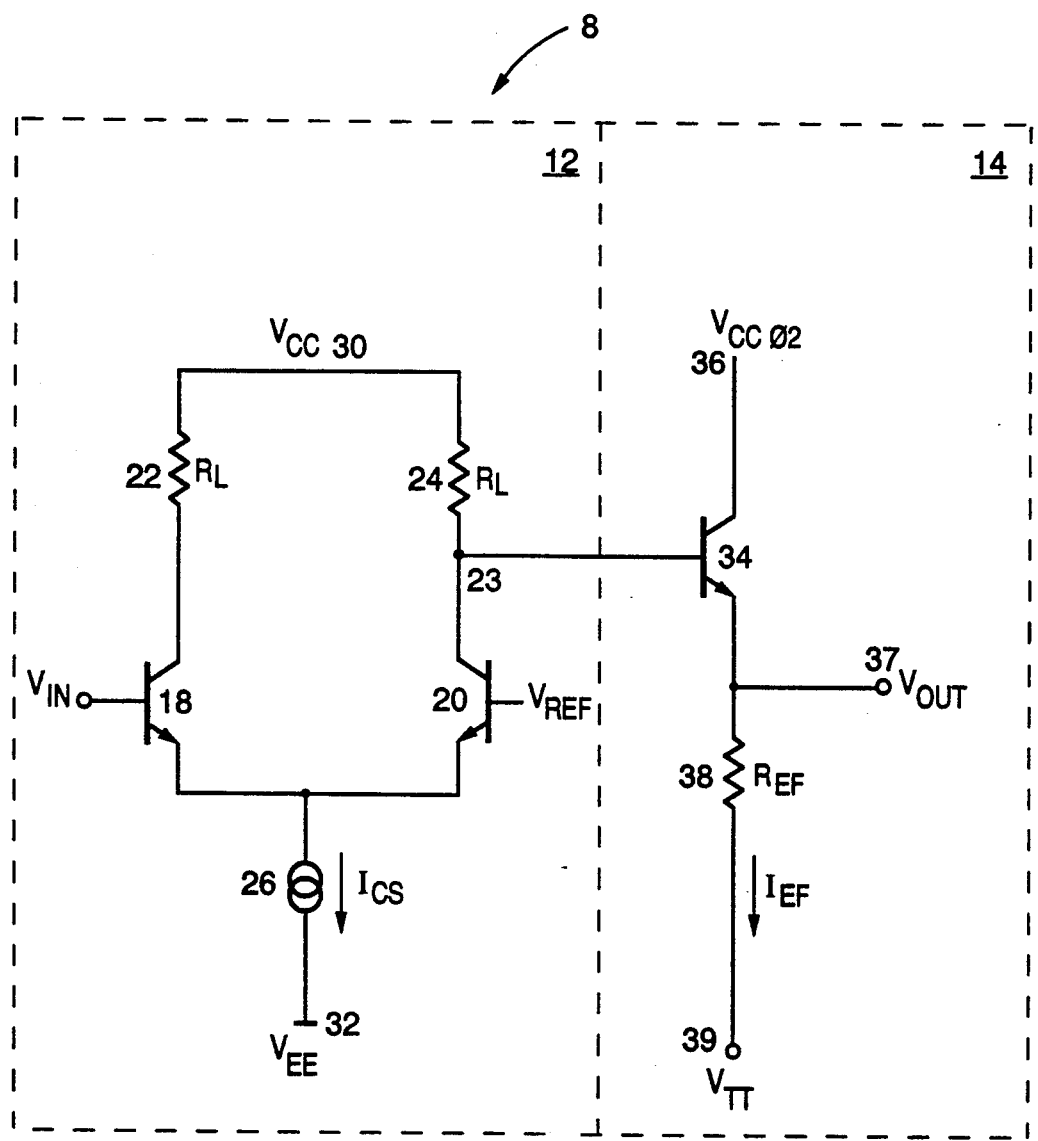
FIG. 1 is a schematic diagram of a conventional logic circuit.
Figure 2:
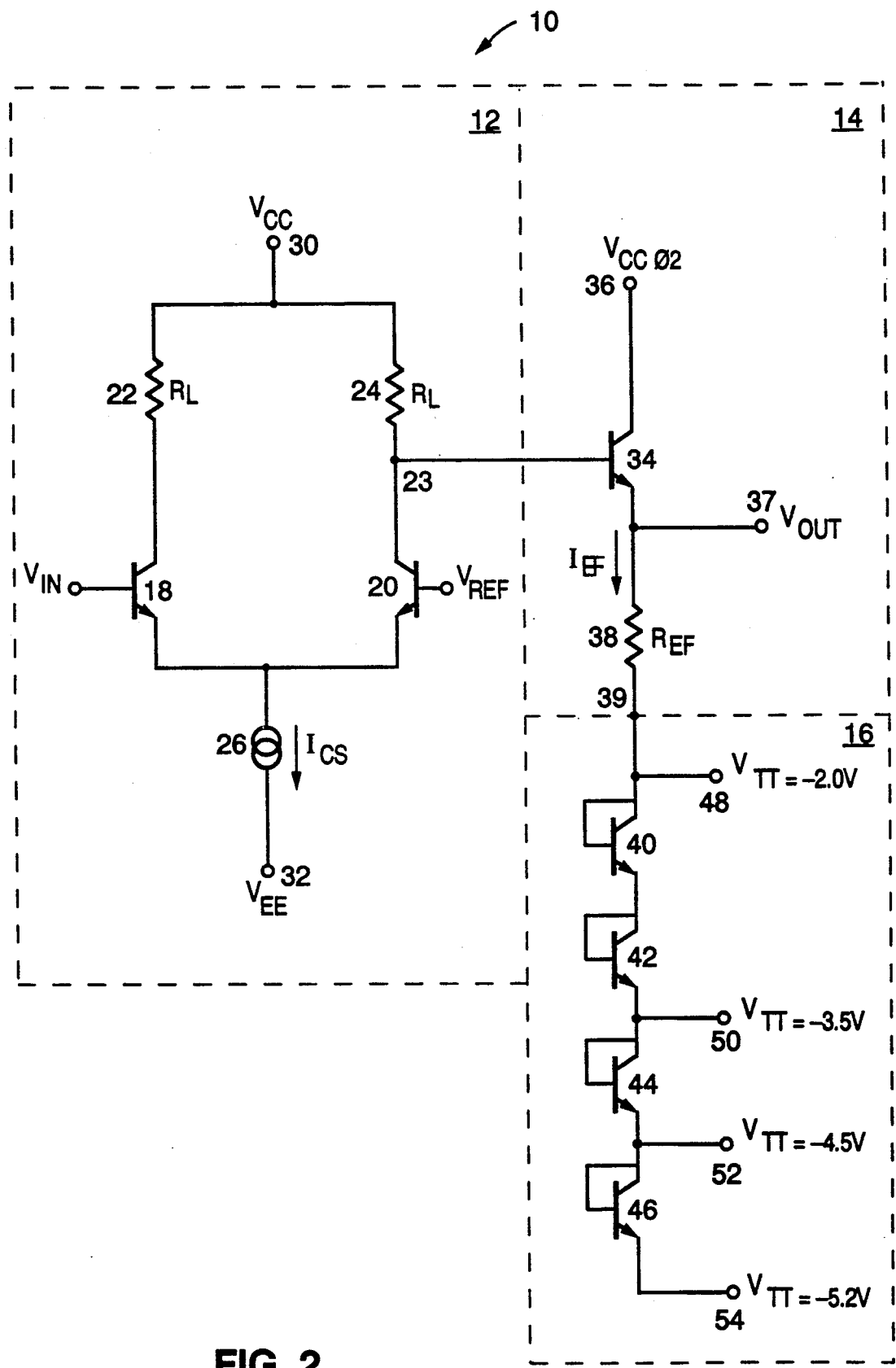
FIG. 2 is a schematic diagram of a preferred embodiment of the present invention wherein the programmable connecting means and the maintaining means comprise diode connected transistors.

FIG. 2 illustrates a preferred embodiment of a logic circuit 10 in accordance with the present invention. It is essentially an improved version of the Emitter-Coupled Logic (ECL) circuit 8 of FIG. 1. The logic circuit 10 can be connected to any voltage supply Vtt which supplies either −2.0, −3.5, −4.5, or −5.2 Volts. When connected to any one of these alternative voltage supplies, the current Ief which flows through the resistor 38 in the emitter follower output circuit 14 will be maintained at substantially the same level.

The logic circuit 10 includes a voltage-comparator circuit 12, an emitter follower output circuit 14, and programmable connecting and maintaining circuitry 16. Although the structure and operation of the voltage-comparator circuit 12 and the emitter follower output circuit 14 have already been discussed in above, a more detailed description of these circuits will be discussed here followed by a detailed description of the structure and operation of the programmable connecting and maintaining circuitry 16.

The voltage-comparator circuit 12 includes a first NPN transistor 18 which receives the digital input signal Vin at its base. The collector of transistor 18 is connected to a resistor 22 which is connected to a voltage supply Vcc at node 30. The emitter of transistor 18 is connected to the emitter of a second NPN transistor 20 which receives the reference voltage signal Vref at its base. The emitters of transistors 18 and 20 are commonly connected to voltage supply Vee at node 32 via a constant current source 26 which supplies a current Ics. The collector of transistor 20 is connected to a second resistor 24 which is connected to the voltage supply Vcc at node 30. The collector of transistor 20 is connected to the emitter follower output circuit 14 at node 23.

During operation, as discussed above, the digital input signal Vin, which is generated by other logic circuits present in the digital system, has a certain predetermined "dynamic signal range" bounded by about −1.5 Volts for LOW logic level and about −0.9 Volts for HIGH logic level. The reference voltage signal Vref is set at the midpoint of the dynamic signal range, or at about −1.2 Volts.

The voltage-comparator circuit 12 determines whether the digital input signal Vin is at a HIGH or LOW logic level by determining whether it is above or below the reference voltage signal Vref. This determination is made in the following manner. When the digital input signal Vin is LOW (−1.5 Volts), transistor 18 will be off and current Ics will flow through transistor 20. Because there will be a voltage drop across resistor 24, the collector of transistor 20 will be LOW. Thus, the signal generated at node 23 will be LOW indicating that the voltage of the digital input signal Vin is less than the voltage of the reference voltage signal Vref (i.e., Vin=−1.5<Vref=−1.2).

Conversely, when the digital input signal Vin is HIGH (−0.9 Volts), current Ics will flow through transistor 18 and transistor 20 will be off. Because no current will flow through resistor 24, there will be no voltage drop across resistor 24, and the collector of transistor 20 will be at a HIGH logic level. Thus, the signal generated at node 23 will be HIGH indicating that the voltage of the digital input signal Vin is larger than the voltage of the reference voltage signal Vref (i.e., Vin=−0.9>Vref=−1.2). The signal generated at node 23 is then delivered to the emitter follower output circuit 14.

The emitter follower output circuit 14 includes a third NPN transistor 34 which receives the signal generated at node 23 at its base. The collector of transistor 34 is connected to a voltage supply Vcc02 at node 36. The emitter of transistor 34 is connected to a third resistor 38 which has a resistance Ref. In the conventional logic circuit 8 of FIG. 1, the other lead of resistor 38 is connected to a voltage supply Vtt at node 39. In the improved logic circuit 10 of FIG. 2, however, the other lead of resistor 38 is connected to the programmable connecting and maintaining circuitry 16 at node 39. This circuitry 16 is then programmably connected to the voltage supply Vtt in a manner discussed below.

As is well known in the art, the output voltage of an emitter follower circuit follows its input (base) voltage quite closely. Thus, when a LOW signal is received at the base of transistor 34, the emitter of transistor 34 is held LOW, and a LOW digital output signal Vout is produced at output node 37. Conversely, when a HIGH signal is received at the base of transistor 34, the emitter of transistor 34 is pulled HIGH, and a HIGH digital output signal Vout is produced at output node 37. Thus, a HIGH digital input signal Vin produces a HIGH signal at node 23 which causes the emitter follower output circuit 14 to produce a HIGH digital output signal Vout at output node 37.

The programmable connecting and maintaining circuitry 16 is the circuitry which connects logic circuit 10 to the voltage supply Vtt. As discussed above, it has become common for the conventional logic circuit 8 of FIG. 1 to be connected to one of four alternative levels of voltage supply Vtt, namely, −2.0, −3.5, −4.5, or −5.2 Volts. The programmable connecting and maintaining circuitry 16 of FIG. 2 permits the logic circuit 10 to be connected to any one of these four voltage levels. Furthermore, no matter which voltage level is chosen, the resistance Ref of resistor 38 will not have to be changed in order to maintain the same current Ief flowing through resistor 38 in the emitter follower output circuit 14. The programmable connecting and maintaining circuitry 16 will automatically restore the current Ief to its proper level for each different value of the voltage supply Vtt.

The programmable connecting and maintaining circuitry 16 includes a chain of four diode connected NPN transistors 40, 42, 44, and 46 connected in series to node 39 of the emitter follower output circuit 14. A diode connected transistor is one having its base and collector connected together so that the transistor functions as a diode. The point in the chain where the voltage supply Vtt is connected depends upon which level of Vtt is chosen. If Vtt is chosen to be −2.0 Volts, then the voltage supply Vtt is connected to node 48. If −3.5 Volts is chosen, then the voltage supply Vtt is connected to node 50. If −4.5 Volts is chosen, then the voltage supply Vtt is connected to node 52. And if −5.2 Volts is chosen, then the voltage supply Vtt is connected to node 54.

The circuitry 16 relies on a "voltage level shift" phenomenon in order to operate; this phenomenon occurs as follows. The resistance Ref of the resistor 38 is designed to give the proper current Ief as if a voltage supply Vtt of −2.0 volts were connected to node 39. Once this value of Ref is chosen it is not changed. Thus, if in fact a Vtt of −2.0 Volts is used, by connecting it to node 48, which is the same node as node 39, the current Ief will be at its proper level and the transistors 40, 42, 44, and 46 will essentially not be used.

If the voltage supply Vtt is chosen to be −3.5 Volts, by connecting it to node 50, current will flow through transistors 40 and 42 which will result in about a 0.75 to 0.86 Volt drop across each transistor. Assuming the average voltage drop across each transistor to be about 0.8 Volts, the voltage at node 39 will be about equal to −3.5+0.8+0.8=−1.9 Volts. This voltage, which is roughly equal to −2.0 Volts, is the voltage needed at node 39 in order for the chosen value of Ref to provide the proper level was "shifted" to node 39.

In a similar manner, if Vtt is chosen to be −4.5 Volts, by connecting it to node 52 there will be a 0.8 Volt drop across each of the transistors 40, 42, and 44. The voltage at node 39 will be about equal to −4.5+0.8+0.8+0.8=−2.1 Volts, or roughly −2.0 Volts. If Vtt is chosen to be −5.2 Volts, by connecting it to node 54 there will be a 0.8 Volt drop across each of all four transistors 40, 42, 44 and 46. The voltage at node 39 will again be about equal to −5.2+0.8+0.8+0.8+0.8=−2.0 Volts. Therefore, no matter which value of Vtt is chosen, the voltage "shifted" to node 39 will always be about −2.0 Volts, the value that resistor 38 needs to insure that the current Ief is at its proper level. It should be noted that when Vtt is equal to −3.5 and −4.5 Volts the voltage at node 39 is not exactly −2.0 Volts (i.e., it is −1.9 and −2.1 Volts). These values are within acceptable tolerances, however, for the logic circuit 10 to function properly and for the current Ief to be at its proper level.

Figure 3:
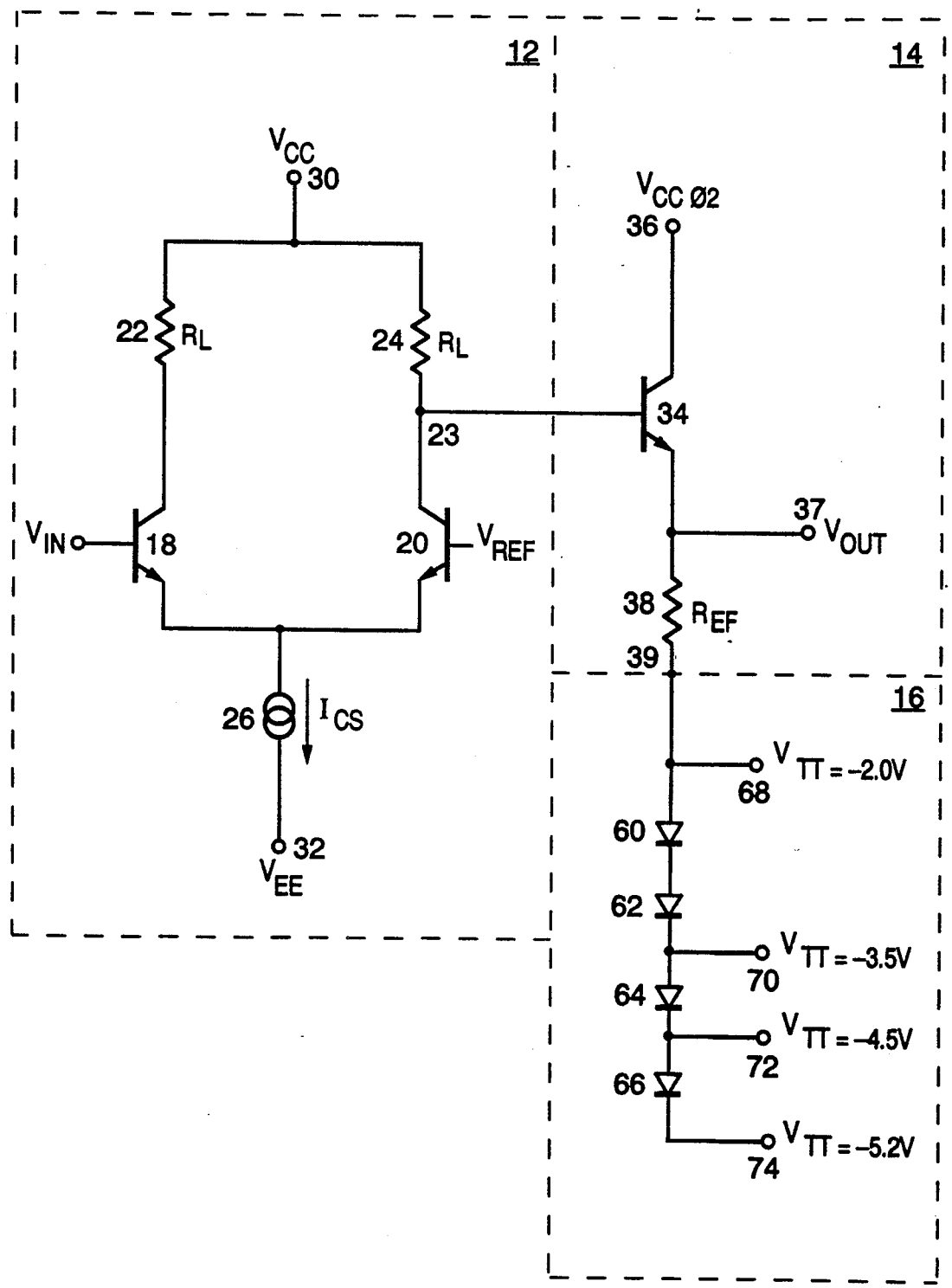
FIG. 3 is a schematic diagram an alternative embodiment of the present invention wherein the programmable connecting means and the maintaining means comprise diodes.

FIG. 3 illustrates an alternative embodiment of the programmable connecting and maintaining circuitry 16. As shown in FIG. 3, the programmable connecting and maintaining circuit 16 may include a plurality of diodes 60, 62, 64, and 66 connected in series to node 39. If a voltage supply Vtt supplying a level of −2.0 Volts is used, then it is connected to node 68. If a Vtt of −3.5 Volts is chosen, then it is connected to node 70. If Vtt is −4.5 Volts, then node 72 is used. And if Vtt is −5.2 Volts, then node 74 is used. The theory of operation of this circuit is identical to that of the diode connected transistors 40, 42, 44, and 46 in FIG. 2.

One reason that diode connected transistors or diodes are used in the programmable connecting and maintaining circuitry 16 is because the approximately 0.8 Volt drop phenomenon described above. As was illustrated in the above calculations, the voltage drop across each transistor shifts the correct voltage level to node 39 which restores the current Ief to its proper level. Theoretically, resistors, instead of diode connected transistors or diodes, could be used to give this same result. While resistors can be used, they have at least one disadvantage; namely, in a semiconductor device, resistors physically occupy a significantly greater amount of space than transistors or diodes.

Once the user determines which voltage supply level Vtt is to be used with the logic circuit 10, the user needs a way to insure that the voltage supply Vtt is connected to the correct voltage supply node, namely, either node 48, 50, 52, or 54. The programmable connecting and maintaining circuitry 16 has the advantage that it can be easily programmed to connect the voltage supply Vtt to the correct node. There is a simple method for the user to use to program the connection.

The method of programming the circuitry 16 so that the voltage supply Vtt is connected to the proper node is as follows. In a gate array environment the four diode connected transistors 40, 42, 44, and 46 (or diodes 60, 62, 64, and 66) are fabricated next to each other in a straight line across one end of a gate array macro-cell. The Vtt power bus, which is connected to the voltage supply Vtt, is connected to the emitter of transistor 46 at node 54. This connection alone would permit the user to use a voltage supply Vtt of −5.2 Volts. However, if the user wishes to use a different level of Vtt, then in one mask step using standard overlay techniques, one or more of the transistors 40, 42, 44, or 46 is shorted out. Once a transistor is shorted out there is no voltage drop across it. The number of shorted out transistors determines which voltage supply level Vtt can be used. For example, if the user wishes to use a voltage supply Vtt of −4.5 Volts, then transistor 46 must be shorted out in the mask step. By shorting out transistor 46, nodes 52 and 54 become the same node. The voltage supply Vtt power bus, which was originally only connected to node 54, is now effectively connected to node 52, which is where connection should be made for a voltage supply Vtt of −4.5 Volts. If the user wishes to use a voltage supply Vtt of −3.5 Volts, then transistors 44 and 46 must be shorted out in the mask step so that nodes 50, 52, and 54 are common with each other. This results in the Vtt power bus being effectively connected to node 50. And if the user wishes to use a voltage supply Vtt of −2.0 Volts, then all of the transistors 40, 42, 44, and 46 must be shorted out in the mask step so that nodes 48, 50, 52, and 54 are all common with each other. This results in the Vtt power bus being effectively connected to node 48. Therefore, the choice of which of the nodes 48, 50, 52, and 54 to connect to the Vtt power bus (which connects to the voltage supply Vtt) is selectively programmed by the user and implemented in one mask step using standard overlay techniques.

While the programmable connecting and maintaining circuitry 16 provides the flexibility of allowing the logic circuit 10 to be connected to a plurality of alternative voltage supplies, there is a trade off which must be made to achieve this flexibility. The diode connected transistor chain 40, 42, 44, and 46, or diode chain 60, 62, 64, and 66, tend to make the logic circuit 10 slightly more sensitive to variations in temperature. The increased temperature sensitivity, however, is minimal enough that the circuitry 16 is still extremely useful in many different types of applications.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. In an Emitter-Coupled Logic (ECL) circuit having a voltage comparator circuit connected to an emitter follower output circuit, the emitter follower output circuit comprising a transistor having its emitter connected to a first terminal of a resistor, and wherein the emitter follower output circuit produces a current in the resistor during operation of the ECL circuit, an improvement in the emitter follower output circuit comprising:

a plurality of n diode-connected transistors connected in series to the resistor, a first in the series of diode-connected transistors having its collector connected to a second terminal of the resistor and each succeeding diode-connected transistor in the series, up to an nth diode-connected transistor, having its collector connected to the emitter of the preceding diode-connected transistor in the series;

wherein, the collector of the first diode-connected transistor and the emitter of the nth diode-connected transistor form first and second voltage supply nodes such that either one of the voltage supply nodes may be connected to any one of a plurality of alternative voltage supplies; and wherein, n is equal to a number such that substantially the same level of average current flowing through the resistor is maintained whether the first voltage supply node is connected to a first of the plurality of alternative voltage supplies or the second voltage supply node is connected to a second of the plurality of alternative voltage supplies, the average current being maintained at substantially the same level because of a voltage drop that occurs across the plurality of diode-connected transistors.

2. The Emitter-Coupled Logic (ECL) circuit of claim 1:

wherein, n is equal to four such that four diode-connected transistors are connected in series to the resistor; and wherein, substantially the same level of average current flowing through the resistor is maintained when the collector of the first diode-connected transistor is connected to an approximately −2.0 Volt voltage supply, the collector of the third diode-connected transistor is connected to an approximately −3.5 Volt voltage supply, the collector of the fourth diode-connected transistor is connected to an approximately −4.5 Volt voltage supply, or the emitter of the fourth diode-connected transistor is connected to an approximately −5.2 Volt voltage supply.

* * * * *